US006933760B2

(12) United States Patent
Haider et al.

(10) Patent No.: US 6,933,760 B2
(45) Date of Patent: Aug. 23, 2005

(54) REFERENCE VOLTAGE GENERATOR FOR HYSTERESIS CIRCUIT

(75) Inventors: Nazar Syed Haider, Fremont, CA (US); Sooseok Oh, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/666,508

(22) Filed: Sep. 19, 2003

(65) Prior Publication Data

US 2005/0062522 A1 Mar. 24, 2005

(51) Int. Cl.[7] ....................... H03K 3/353; H03K 17/687

(52) U.S. Cl. ....................... 327/206; 327/408; 327/543; 323/313

(58) Field of Search ................................ 327/206, 208, 327/210, 541, 543, 407–413; 326/23, 24; 323/313, 314

(56) References Cited

U.S. PATENT DOCUMENTS 4,849,661 A 7/1989 Bazes
4,945,259 A * 7/1990 Anderson .................. 327/540
5,528,129 A * 6/1996 Kaneko et al. ............. 323/313
5,614,851 A * 3/1997 Holzer et al. ................. 327/58
5,894,244 A * 4/1999 Ukita ......................... 327/541
6,552,603 B2 * 4/2003 Ueda .......................... 327/541
6,587,323 B1 7/2003 Falconer
6,628,108 B1 9/2003 Taub et al.
6,781,428 B2 * 8/2004 Chao et al. ................. 327/206

* cited by examiner

*Primary Examiner*—Timothy P. Callahan
*Assistant Examiner*—Terry L. Englund
(74) *Attorney, Agent, or Firm*—Schwabe, Williamson & Wyatt, P.C.

(57) ABSTRACT

A voltage reference generator for a hysteresis circuit, comprising a first originator circuit to generate a first reference voltage; a second originator circuit to generate a second reference voltage; and a selector circuit, coupled to the first and second originator circuits, to select one of the first and second reference voltages to be an output reference voltage based upon an input signal to the hysteresis circuit undertaking a low-to-high or a high-to-low signal transition respectively. The first originator circuit includes a first plurality of channel devices selected from either p-channel devices or n-channel devices and the second originator circuit includes a second plurality of channel devices selected from the other one of the p-channel devices and the n-channel devices.

20 Claims, 5 Drawing Sheets

REFERENCE VOLTAGE GENERATOR FOR HYSTERESIS CIRCUIT

BACKGROUND OF THE INVENTION

1. Field of the Invention

The present invention relates to electronic devices, and in particular, to reference voltage generators.

2. Description of Related Art

Noise on input pins of microprocessors continues to play an ever crucial role in more recent designs. Increased complexity of these systems leads to increased density of signals and this, combined with greater signaling speeds, produces larger system switching noise as well as cross-talk noise. Further, continued reduction of supply voltages also reduces noise-margins and a general degradation of overall system noise immunity. Cost pressures that contribute to a reduction in the number of layers and an increased variability of line parameters in printed circuit boards (PCBs) produce an overall reduction in signal quality of even the choicest routes. In many designs, signals that are more critical in terms of noise and speed receive the shortest and choicest routes while signals that are slower and somewhat less timing critical end up with fairly lengthy and not the most desirable routes. In such designs, these types of signals end up with the worst level of noise and signal integrity. To make matters worse, backwards design compatibility to legacy systems forces even newer designs to stick to design requirements that were deemed marginal to begin with. All of these factors tend to force silicon designers to continually improve their receiver noise immunity on newer designs. This, by itself, is a challenge as reduced supply voltages continually degrade noise rejection of input receivers.

One technique to improve the noise margin of input receivers is the use of hysteresis. Hysteresis is a technique that improves noise margin by shifting the switching point of a given receiver up for a rising edge input and down for a downward switching signal. The transfer characteristic of a receiver with hysteresis is shown in FIG. 1. In many designs it is sufficient to just build some hysteresis into the receiver without actually bounding the actual design by requiring some voltage limits on it. Thus, FIG. 1 shows a receiver with a minimum hysteresis above or below the mid-point of the input transition.

As shown in FIG. 2, in many applications just having minimum hysteresis does not suffice and the design is expected to incorporate a maximum limit of hysteresis for both the low-to-high (L-H) and the high-to-low (H-L) transitions. In this case, the design requirement is such that the input receiver transitions within the voltage bands shown in this FIG. 2 by the maximum and minimum voltages Vh− and Vh+. This constraint is important in systems where incoming signals do not switch rail to rail or even in systems where the incoming signal is expected to slow down considerably beyond a certain point of its transition. Furthermore, in many applications it is required that the receiver switches precisely at the threshold switching voltages Vh+ and a Vh− for signals that are very timing critical. A typical specification sheet for such input pins is shown below in Table I below with minimum and maximum Vh+/Vh− voltages.

TABLE I

| | | |
|---|---|---|
| Vh+ input LH threshold voltage | (VCC + VHYS_MIN)/2.0 | (VCC + VHYS_MAX)/2.0 |
| Vh− input HL threshold voltage | (VCC − VHYS_MAX)/2.0 | (VCC − VHYS_MIN)/2.0 |

With these specification, (VHYS_MAX-VHYS_MIN)/2.0 is the maximum range of a hysteresis variation window. In summary, the invariability of the voltages Vh+ and Vh− is critical in many applications.

There are number of methods in the prior art to incorporate hysteresis into an input receiver for a microprocessor pin. As shown in FIG. 3, typically a hysteresis circuit 10 for an input receiver includes a reference voltage generator 12 which is controlled by an OUTPUT signal of a sensing amplifier 14. The sensing amplifier 14 is a comparator, which has a digital one (high level output voltage) or digital zero (low level output voltage). The transition from one level to another occurs at the value given by the reference voltage $V_{REF}$. In other words, the sensing amplifier 14 is used to determine when a voltage of the INPUT signal goes above the threshold reference voltage $V_{REF}$ and thereafter produces a one output when that occurs.

If the output of the sensing amplifier 14 is low, the voltage of reference generator 12 is pulled up to the Vh+ value, as shown in FIG. 4. If the output is a high, the voltage of the reference generator 12 is pulled down to Vh− value (Vh− shown in FIG. 4, but not a corresponding input and output signals). In this manner, this hysteresis circuit 10 implements the characteristics shown in FIG. 2 by switching at the voltage Vh+ on a rising edge and the voltage Vh− on a falling edge. As mentioned earlier, many systems require very tight voltage bands around the voltages Vh+ and Vh−.

With reference to FIG. 5, there is shown an implementation of a prior art reference generator 12 for the hysteresis circuit 10. It includes three p-channel transistors 18, 20, and 22 and two n-channel transistors 24 and 26. The two n-channel transistors in may easily be replaced with just one. The variation of Vh+ or Vh− voltages for a given supply voltage Vcc is primarily determined by the process variation and temperature. The signal $V_{REF}$_CTRL in FIG. 3 is either a digital one or zero depending on what the voltage $V_{REF}$ needs to be.

DETAILED DESCRIPTION OF AN ILLUSTRATIVE EMBODIMENT

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Figure 3:
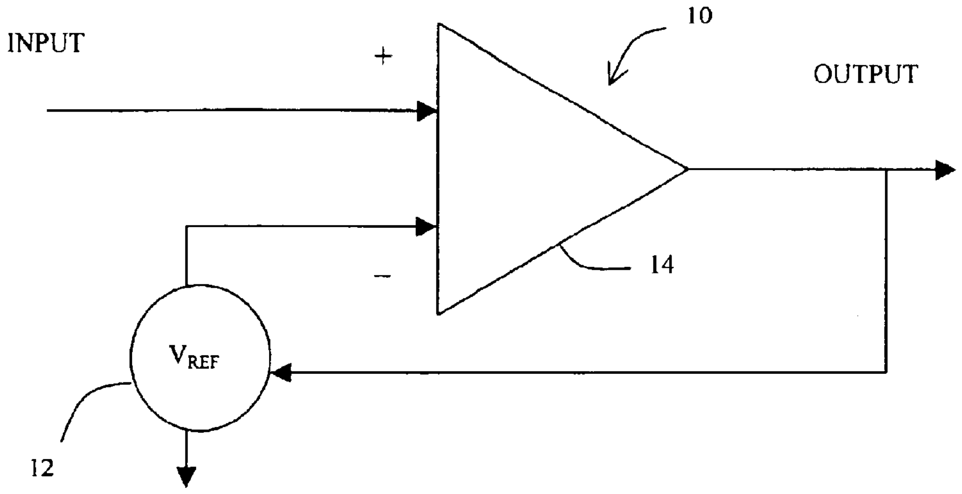
FIGURE 3 ( PRIOR ART )
FIG. 3 is a block diagram of a prior art hysteresis circuit having a reference voltage generator.
Figure 6:
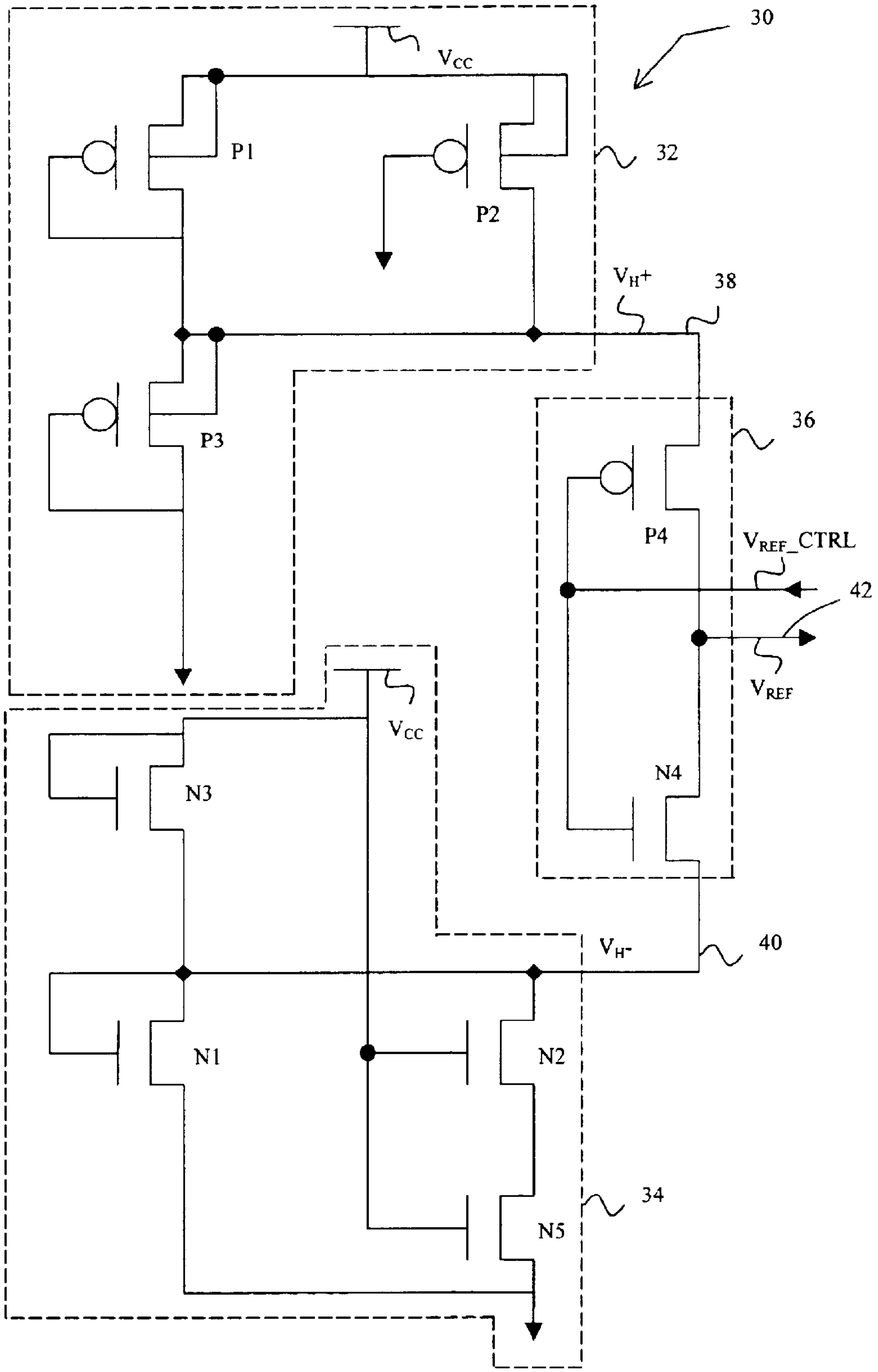
FIG. 6 is a schematic diagram of a reference voltage generator in accordance with one embodiment of the present invention.
Figure 7:
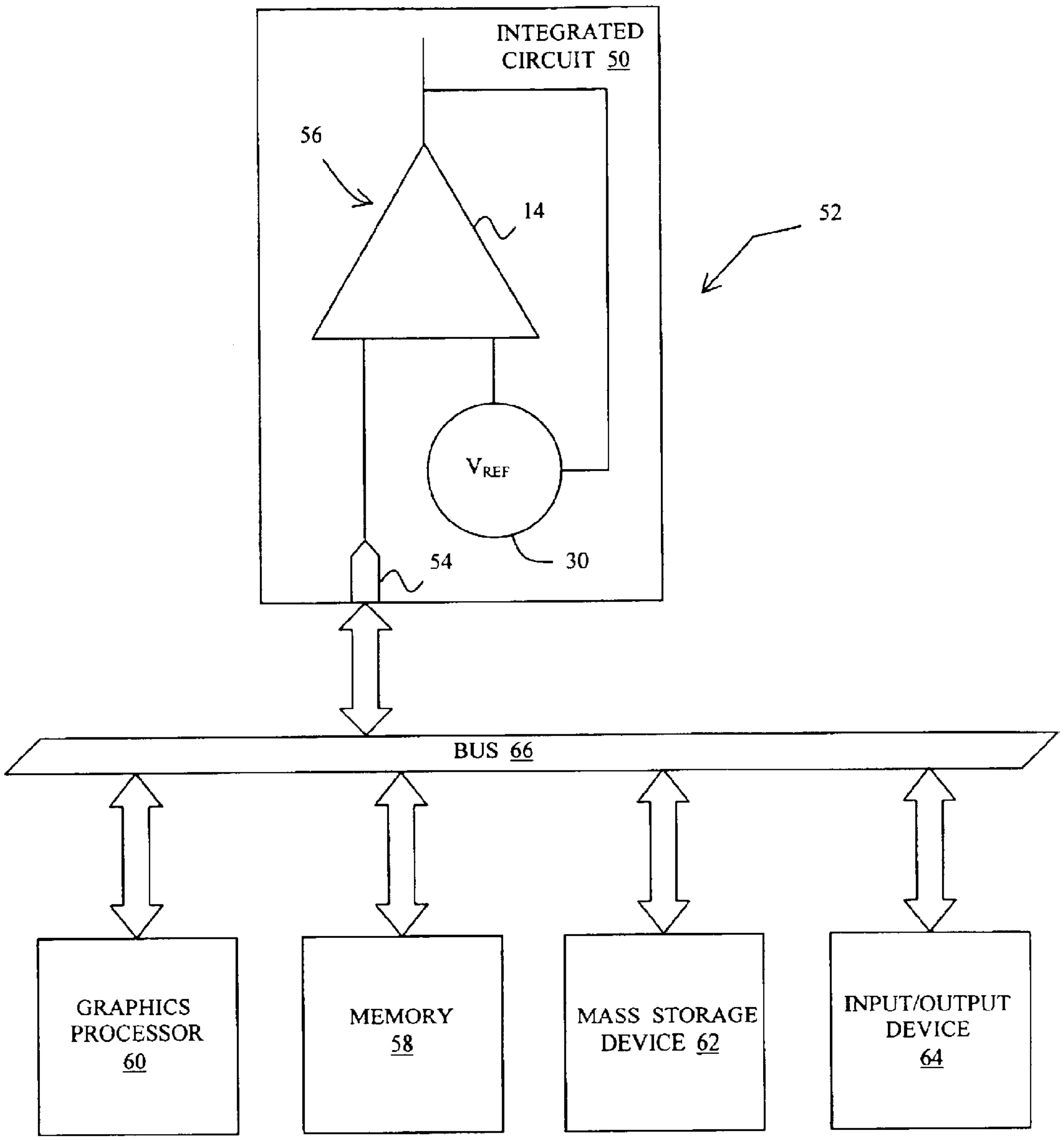
FIG. 7 is a block diagram of a system having an integrated circuit including a hysteresis circuit incorporated with the reference voltage generator shown in FIG. 6, in accordance with one embodiment.

With reference to FIG. 6, a reference voltage generator 30 in accordance with one embodiment of the present invention is shown for use in the hysteresis circuit (as depicted in FIGS. 3 and 7). For the embodiment, the reference voltage generator 30 generates two distinct reference voltage levels. The reference voltage generator 30 includes: a first originator circuit 32 which generates a first reference voltage Vh+; a second originator circuit 34 which generates a second reference voltage Vh−; and a selector circuit 36 which selects as an output reference voltage one of the first and second reference voltages based upon the input signal to the hysteresis circuit undertaking a high-to-low (H-L) signal transition or low-to-high (L-H) signal transition, respectively. This embodiment of the reference voltage generator 30 takes the place of the prior art reference voltage generator 12 in FIG. 3, with the rest of the hysteresis circuit 10 remaining identical to that shown in FIG. 3. Hence, when referring to the hysteresis circuit, the already provided discussion of the hysteresis circuit 10 in FIG. 3 shall be referred to. As is described hereinafter, the hysteresis circuit with the generator 30 is also described in respect to FIG. 7.

Figure 1:
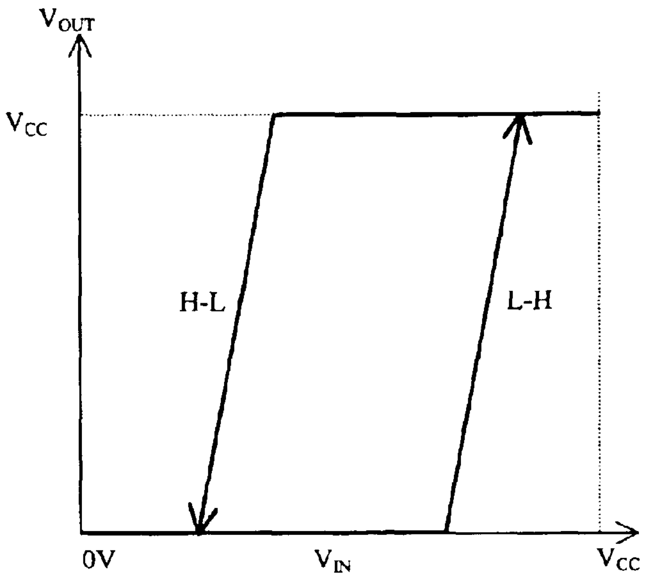
FIGURE 1 ( PRIOR ART )
FIG. 1 shows transfer characteristics of a prior art input receiver with hysteresis.
Figure 2:
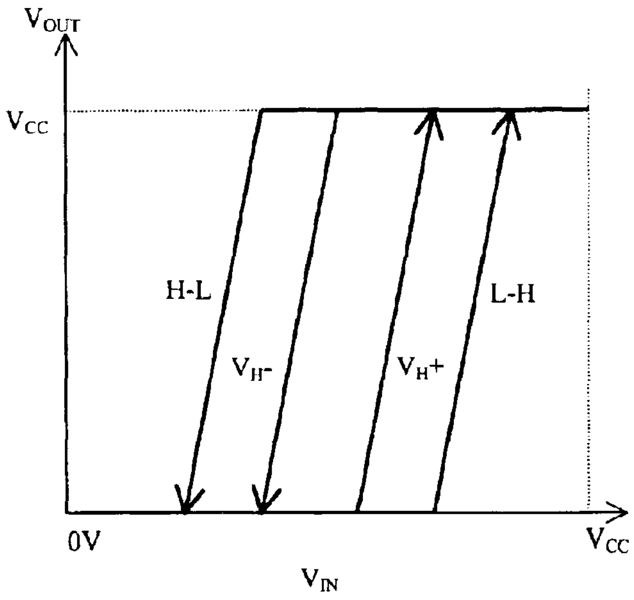
FIGURE 2 ( PRIOR ART )
FIG. 2 shows transfer characteristics of a prior art input receiver with hysteresis Vh+ and Vh− voltage ranges.
Figure 4:
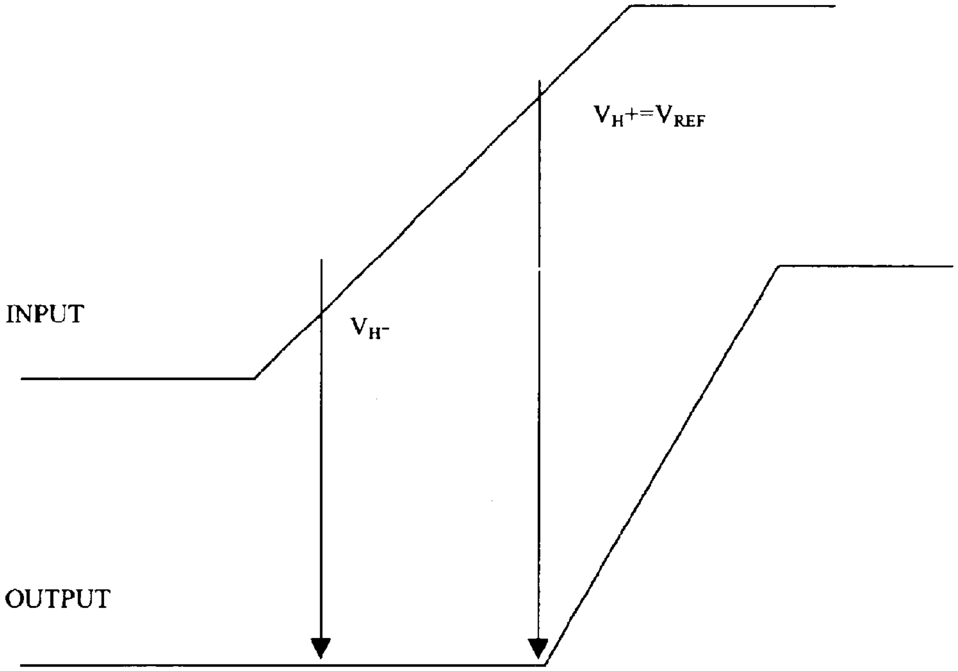
FIGURE 4 ( PRIOR ART )
FIG. 4 is a signal diagram for the prior art hysteresis circuit of FIG. 3.

As shown in FIGS. 2, 3 and 4, the reference voltage generator 30 is designed for those applications where just having minimum hysteresis does not suffice. Instead, the design is expected to incorporate a maximum limit of hysteresis for both the L-H signal transition (rising signal) and the H-L signal transition (falling signal) of the input signal to the sensing amplifier 14 (FIG. 3) to trigger the output signal of the sensing amplifier 14. In other words, these applications have a fairly tight hysteresis window or specification for noise rejection purposes and require that a stable reference voltage be generated. As previously described, the input receiver transitions within the voltage bands of FIG. 2 are shown by the minimum and maximum voltages Vh+ (a first reference voltage) and Vh− (a second reference voltage). The reference voltages Vh+ and Vh− create different trip points (switching levels) for the L-H and H-L signal transitions of the output signal of the hysteresis circuit 10 as shown in FIG. 4. After the output signal of the hysteresis circuit 10 transitions low, the selector circuit 36 selects the first reference voltage Vh+ as the output reference voltage. After the output signal of the hysteresis circuit 10 transitions high, the selector circuit 36 selects the second reference voltage Vh− as the output reference voltage.

Figure 5:
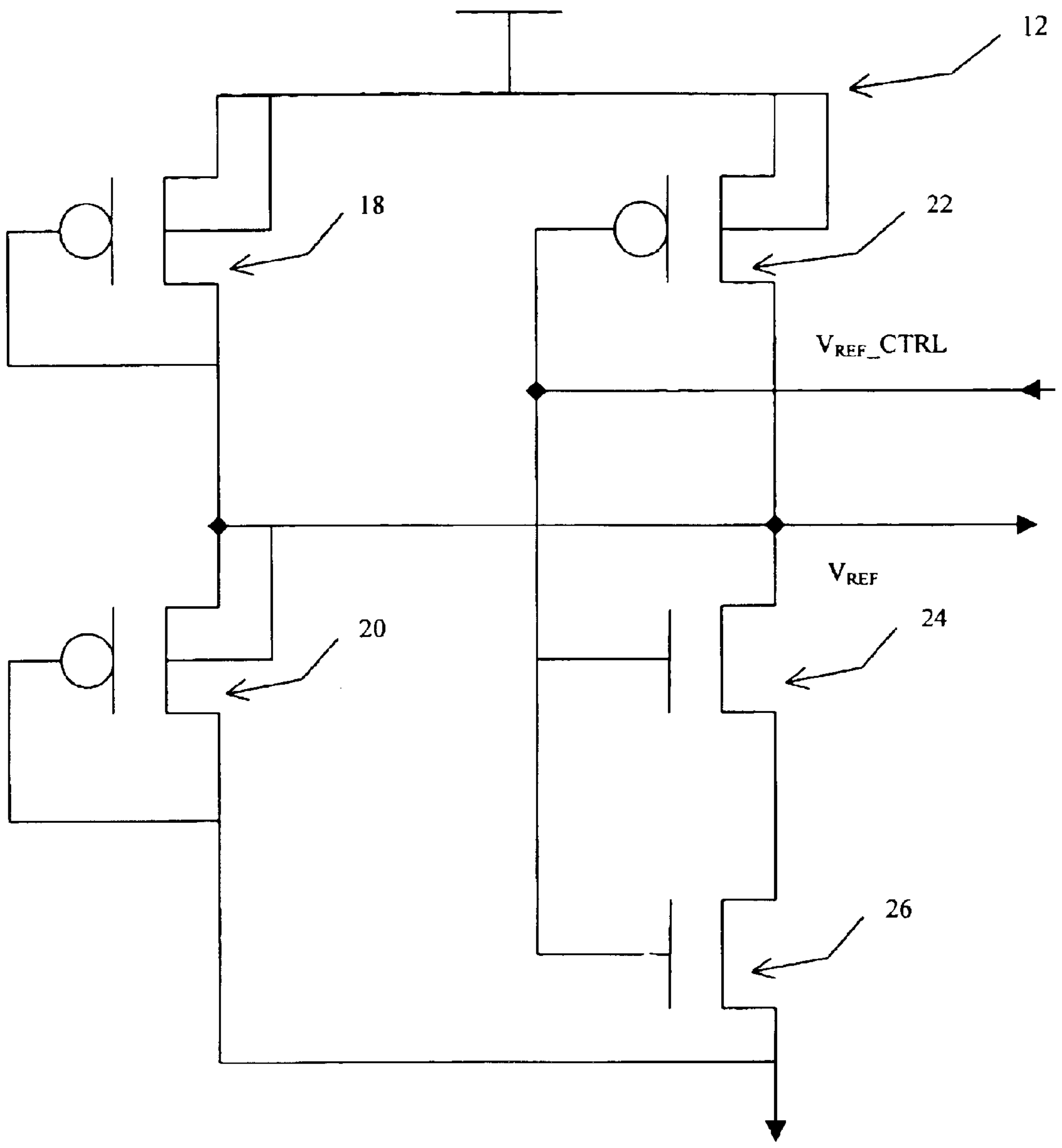
FIGURE 5 ( PRIOR ART )
FIG. 5 is a schematic diagram of the prior art reference voltage generator shown in FIG. 3.

With reference to FIGS. 3 and 6, the reference voltage generator 30 for the hysteresis circuit 10 is much more tolerant to process and temperature changes and therefore is able to significantly reduce the variation of the reference voltages Vh+ and Vh−. The reference voltage generator 30 reduces the variability of the output reference voltage by using two sets of substantially identical transistors: one in the first originator circuit 32 for the Vh+ band and another in the second originator circuit 34 for the Vh− band. The selection of the appropriate band is still done by the feedback from the output signal of the sensing amplifier 14. As compared with the prior art reference voltage generator of FIG. 5, it is anticipated that the reference voltage generator 30 reduces the variation of the reference voltages Vh+/Vh− by approximately 45%. The reason for this reduction is at least partially attributable to the fact that each band is generated by the same kind of transistor. More specifically, in the illustrative embodiment of FIG. 6, the first originator circuit 32 is formed of p-channel devices (i.e., p-transistors) and the second originator circuit 34 is formed by n-channel devices (i.e., n-transistors). In general, the variability of process parameters is substantially more controlled with one type of transistors than across two different types of transistors. Thus, variation within all n-transistor parameters, which determine its characteristics, impacts all of the n-transistors in the same way. To the contrary, with the prior art reference voltage generator of FIG. 5, process variation could impact the p-channel and the n-channel transistors differently and result in a much larger change in the reference voltages Vh+ and Vh−. Furthermore, in a triple well process, tying the bulk of the n-channel transistors similar to that of the p-channel transistors reduces the variability of second reference voltage Vh− even further.

Referring to FIG. 6, the reference voltage generator 30 includes a supply voltage $V_{CC}$ and a ground. The first originator circuit 32 including a first reference voltage node 38 carrying the first reference voltage Vh+ and the second originator circuit 34 including a second reference voltage node 40 carrying the second reference voltage Vh−. The first originator circuit 32 has a first plurality of channel devices, which includes a first p-channel device P1, a second p-channel device P2, and third p-channel device P3. The second originator circuit 34 has a second plurality of channel devices, which includes a first n-channel device N1, a second n-channel device N2, and a third n-channel device N3. Optionally, an additional n-channel device N5 may be included. Without the n-channel device N5, the first and second originator circuits 32 and 34 have the identical number of channel devices, which are similarly arranged but with the circuits 32 and 34 having p-channel devices and n-channel devices, respectively, and with the supply voltage and ground being reversed.

With respect to the first originator circuit 32, the first and second p-channel devices P1 and P2 have their sources coupled to the source voltage and their drains coupled to the first reference voltage node 38. The first transistor P1 has its gate coupled to the first reference voltage node 38 and its active terminal coupled to the supply voltage. The second transistor P2 has its gate coupled to ground and its active terminal coupled to the supply voltage. The third p-channel device P3 has its source coupled to the first reference voltage node 38 and its drain coupled to the ground. The third p-channel device P3 has its gate coupled to ground and its active terminal coupled to the first reference voltage node 38.

With respect to the second originator circuit 34, the first and second n-channel devices N1 and N2 have their drains coupled to the second reference voltage node 40. The n-channel device N1 has its source coupled to the ground. In the optional case where the n-channel transistor N5 is included, then the second n-channel device N2 has its source coupled to the drain of n-channel transistor N5 and the transistor N5 has its source connected to ground. In the case where transistor N5 is not included, then transistor N2 has its source directly coupled to ground. Transistor N1 has its gate coupled to the second reference voltage node 40 and the transistors N3, N2 and N5 have their gates coupled to the supply voltage. The third n-channel device N3 has its drain coupled to the supply voltage and its source coupled to the second reference voltage node 40.

The selector circuit 36 includes an output reference voltage node 42 having the output reference voltage $V_{REF}$, which is provided to the input of the sensing amplifier 14

(FIGS. 3 and 7). The selector circuit 36 includes a fourth p-channel device P4 and a fourth n-channel device N4. The fourth p-channel device P4 has its drain coupled to the output reference voltage node 42 and its source coupled to the first reference voltage node 38. The fourth n-channel device N4 has a drain coupled to the output reference voltage node 42 and its source coupled to the second reference voltage node 40. The two gates of the transistors P4 and N4 are coupled to the output of the sensing amplifier 14 shown in FIGS. 3 and 7.

Referring to FIGS. 3 and 6, when the output signal of the sensing amplifier 14 is a digital 0, the transistor P4 is turned on and transistor N4 off, so that the voltage $V_{REF}$ becomes voltage Vh+. When the output signal of the sensing amplifier 14 is a digital 1, the transistor P4 is turned off and transistor N4 on, so that the voltage $V_{REF}$ becomes voltage Vh−.

Referring to FIG. 6, the portion of the reference voltage generator 30 involved with hysteresis control includes not only the selector circuit 36, but also the transistors P2, N2 and N5. For the first originator circuit 32, the transistor P2 modulates or adjusts the first reference voltage generated by the transistors P1 and P3. Likewise, for the second originator circuit 34, the transistors N2 and N4 (transistor N4 is optional) modulate or adjust the second reference voltage generated by the transistors N1 and N3.

Referring to FIG. 7, there is illustrated one of many possible systems in which a hysteresis circuit incorporated with the reference voltage generator 30 may be used. The reference voltage generator 30 is implemented in hysteresis circuit 56 of an integrated circuit (IC) 50 having a plurality of input pins, with one being illustrated by a pin 54. Hysteresis circuit 56 includes the sensing amplifier 14 described with respect to FIG. 3 and the reference voltage generator 30 described with respect to FIG. 6 (identical to hysteresis circuit 10 of FIG. 3 except it has the generator 30 instead of the generator 12). In one embodiment, IC 50 is a microprocessor. In alternate embodiments, IC 50 may be an application specific IC (ASIC).

For the embodiment, the system 52 also includes a main memory 58, a graphics processor 60, a mass storage device 62 and an input/output module 64 coupled to each other by way of a bus 66, as shown. Examples of the memory 58 include but are not limited static random access memory (SRAM) and dynamic random access memory (DRAM). Examples of the mass storage device 62 include but are not limited to a hard disk drive, a compact disk drive (CD), a digital versatile disk driver (DVD), and so forth. Examples of the input/output modules 64 include but are not limited to a keyboard, cursor control devices, a display, a network interface, and so forth. Examples of the bus 66 include but are not limited to a peripheral control interface (PCI) bus, an Industry Standard Architecture (ISA) bus, and so forth. In various embodiments, the system 52 may be a wireless mobile phone, a personal digital assistant, a pocket PC, a tablet PC, a notebook PC, a desktop computer, a set-top box, an entertainment unit, a DVD player, and a server.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A hysteresis circuit, comprising:

a sensing amplifier to generate an output signal having an output and two inputs with one of the inputs coupled to an input signal;

a reference generator coupled to the output and the other one of the inputs of the sensing amplifier and responsive to the output signal to generate an output reference voltage;

the reference generator including a first originator circuit to generate a first reference voltage on a first reference voltage node; a second originator circuit to generate a second reference voltage on a second reference voltage node; a selector circuit coupled to the first and second originator circuits to provide as the output reference voltage either the first or second reference voltage based upon the output signal undertaking a falling signal transition or a rising signal transition respectively; a voltage supply; and a ground;

the first originator circuit including a first p-channel device and a second p-channel device coupled in parallel between the voltage supply and the first reference voltage node; and the second originator circuit including a first n-channel device and a second n-channel device coupled in parallel between the second reference voltage node and the ground.

2. The hysteresis circuit of claim 1, wherein the first originator circuit further includes a third p-channel device coupled between the first reference voltage node and the ground.

3. The hysteresis circuit of claim 2, wherein the second originator circuit further includes a third n-channel device coupled between the second reference voltage node and the voltage supply.

4. The hysteresis circuit of claim 3, wherein each of the p-channel and n-channel devices has a source, a drain and a gate; the sources of the first and second p-channel devices are coupled to the voltage supply and the drains of the first and second p-channel devices are coupled to the first reference voltage node; the source of the third p-channel device is coupled to the first reference voltage node and the drain of the third p-channel device is coupled to the ground; the gate of the first p-channel device is coupled to the first reference voltage node; and the gates of the second and third p-channel devices are coupled to the ground.

5. The hysteresis circuit of claim 4, wherein the drains of the first and second n-channel device are coupled to the second reference voltage node and the sources of the first and second n-channel devices are coupled to the ground; the drain of the third n-channel device is coupled to the voltage supply and the source of the third n-channel device is coupled to the second reference voltage node; the gates of the second and third n-channel devices are coupled to the voltage supply; and the gate of the first n-channel device is coupled to the second reference voltage node.

6. The hysteresis circuit of claim 5, wherein the selector circuit is coupled between the first and second reference voltage nodes.

7. The hysteresis circuit of claim 5, wherein the reference voltage generator includes an output reference voltage node having the output reference voltage; and the selector circuit includes a fourth p-channel device and a fourth n-channel device; the fourth p-channel device has the drain coupled to the output reference voltage node and the source coupled to the first reference voltage node and the fourth n-channel device has the drain coupled to the output reference voltage node and the source coupled to the second reference voltage node.

8. The hysteresis circuit of claim 1, wherein the hysteresis circuit is included in an integrated circuit.

9. The hysteresis circuit of claim 8, wherein the integrated circuit is a microprocessor.

10. A system, comprising:

an integrated circuit having a reference generator to generate an output reference voltage; a hysteresis circuit responsive to an input signal and the output reference voltage to generate an output signal; the reference generator including a first originator circuit to generate a first reference voltage on a first reference voltage node; a second originator circuit to generate a second reference voltage on a second reference voltage node; a selector circuit coupled to the first and second originator circuits to provide as the output reference voltage either the first or second reference voltage based upon the output signal undertaking a falling signal transition or a rising signal transition respectively; a voltage supply; and a ground; the first originator circuit including a first p-channel device and a second p-channel device coupled in parallel between the voltage supply and the first reference voltage node; and the second originator circuit including a first n-channel device and a second n-channel device coupled in parallel between the second reference voltage node and the ground:

a DRAM coupled to the integrated circuit; and an input/output interface coupled to the integrated circuit.

11. The system according to claim 10, the integrated circuit further includes a central processing unit, a main memory coupled to the central processor unit and at least one input/output module coupled to the central processor unit and the main memory.

12. The system of claim 10, wherein the first originator circuit further includes a third p-channel device coupled between the first reference voltage node and the ground.

13. The system of claim 12, wherein the second originator circuit further includes a third n-channel device coupled between the second reference voltage node and the voltage supply.

14. The system of claim 13, wherein each of the p-channel devices and n-channel devices has a source, a drain and a gate; the sources of the first and second p-channel devices are coupled to the voltage supply and the drains of the first and second p-channel devices are coupled to the first reference voltage node; the source of the third p-channel device is coupled to the first reference voltage node and the drain of the third p-channel device is coupled to the ground; the gate of the first p-channel device is coupled to the first reference voltage node; and the gates of the second and third p-channel devices are coupled to the ground.

15. The system of claim 14, wherein the drains of the first and second n-channel devices are coupled to the second reference voltage node and the sources of the first and second n-channel device are coupled to the ground; the drain of the third n-channel device is coupled to the voltage supply and the source of the third n-channel device is coupled to the second reference voltage node; the gates of the second and third n-channel devices are coupled to the voltage supply; and the gate of the first n-channel device is coupled to the second reference voltage node.

16. The system of claim 15, wherein the selector circuit is coupled between the first and second reference voltage nodes.

17. The system of claim 15, wherein the reference voltage generator further includes an output reference voltage node having the output reference voltage; and the selector circuit includes a fourth p-channel device an a fourth n-channel device; the fourth p-channel device has the drain coupled to the output reference voltage node and the source coupled to the first reference voltage node and the fourth n-channel device has the drain coupled to the output reference voltage node and the source coupled to the second reference voltage node.

18. The system of claim 10, wherein the integrated circuit is a microprocessor.

19. The system of claim 10, wherein the input/output interface comprises a networking interface.

20. The system of claim 10, wherein the system is a selected one of a set-top box, an entertainment unit and a DVD player.

* * * * *